United States Patent
Ullrich

(10) Patent No.: US 6,335,487 B1
(45) Date of Patent: Jan. 1, 2002

(54) METHOD FOR CONNECTING A CABLE TO A PRINTED CIRCUIT BOARD, AND A HOUSING HAVING A CABLE CONNECTED TO THE PRINTED CIRCUIT BOARD IN ACCORDANCE WITH THE METHOD

(75) Inventor: Horst Ullrich, Schöneck (DE)

(73) Assignee: Mannesmann VDO AG, Frankfurt (DE)

( * ) Notice: Subject to any disclaimer, the term of this patent is extended or adjusted under 35 U.S.C. 154(b) by 0 days.

(21) Appl. No.: 09/489,548

(22) Filed: Jan. 21, 2000

(30) Foreign Application Priority Data

Jan. 22, 1999 (DE) ............................................... 199 02 428

(51) Int. Cl.⁷ .................................................. H01R 13/46
(52) U.S. Cl. .............................. 174/59; 361/772; 439/581
(58) Field of Search .................................. 361/772, 773, 361/774; 439/76.1, 581, 493, 495, 676; 179/59, 50.52

(56) References Cited

U.S. PATENT DOCUMENTS

| | | | |
|---|---|---|---|
| 4,494,308 A | | 1/1985 | Schauer |
| 5,112,249 A | * | 5/1992 | Henry et al. ................. 439/581 |
| 5,909,063 A | * | 6/1999 | Silliman et al. ............. 307/112 |
| 5,949,020 A | * | 9/1999 | Mitchell et al. ......... 174/40 CC |
| 6,064,004 A | * | 5/2000 | Kunnas ........................ 174/65 G |
| 6,146,209 A | * | 11/2000 | Francis ........................ 439/676 |
| 6,164,977 A | * | 12/2000 | Lester .............................. 439/63 |
| 6,176,734 B1 | * | 1/2001 | Juntwait et al. .............. 439/493 |

FOREIGN PATENT DOCUMENTS

| | | |
|---|---|---|
| DE | 1147768 | 4/1963 |
| DE | 1690380 | 5/1971 |
| DE | 3012743 | 10/1981 |
| DE | 3412815 | 10/1985 |
| DE | 19528315 | 12/1996 |
| DE | 19712842 | 8/1998 |
| EP | 0148037 | 7/1985 |

* cited by examiner

Primary Examiner—Dean A. Reichard
Assistant Examiner—Dhiru R Patel
(74) Attorney, Agent, or Firm—Martin A. Farber

(57) ABSTRACT

A housing (1) for holding a printed circuit board (10) has a cable receptacle (2) which is configured as a cutout open toward the side of the printed circuit board (10). A cable (7) is freed from its insulation at its free end, and then positioned over the cable receptacle (2) such that the end of the bared cable strand (9) initially rests on the housing (1). Thereafter, the cable (7) is pressed into the cable receptacle (2), the bared end of the cable strand (9) being bent over by 90°. Subsequently, the printed circuit board (10) is laid onto the housing (1) in such a way that the cable strand (9) penetrates a bore (11) in the printed circuit board (10) and can subsequently be soldered.

7 Claims, 1 Drawing Sheet

METHOD FOR CONNECTING A CABLE TO A PRINTED CIRCUIT BOARD, AND A HOUSING HAVING A CABLE CONNECTED TO THE PRINTED CIRCUIT BOARD IN ACCORDANCE WITH THE METHOD

SUMMARY OF THE INVENTION

FIELD AND BACKGROUND OF THE INVENTION

The invention relates to a method for connecting a cable, which is to be inserted into a cable receptacle of a housing, to a printed circuit board supported by the housing by means of a conductor which is led transverse to the direction of the main extent of the cable from the cable receptacle through the printed circuit board and is soldered to the printed circuit board on the top side thereof. Furthermore, the subject matter of the invention is a housing for holding a printed circuit board, which is provided with a cable receptacle in which a cable having a cable strand is inserted, and which has been connected to the printed circuit board by means of a conductor according to the method in accordance with at least one of the preceding claims.

At present, cables are connected to a printed circuit board by initially connecting the cable end to a soldering pin which penetrates the printed circuit board with a conductor and is soldered to the printed circuit board on the top side thereof. This cable with the soldering pin is inserted into the injection mold for the injection molding of the housing, with the result that the soldering pin is injection-coated with the cable when the housing is produced.

This type of connection of a cable to a printed circuit board requires a soldering pin as a component connecting the cable to the printed circuit board. Since the cable must be positioned with the soldering pin in an injection mold, there is a relatively high outlay on producing the electric connection between the cable and the printed circuit board.

The invention is based on the problem of configuring a method of the type mentioned at the beginning in such a way that a housing can be provided with a cable connecting a printed circuit board with as little outlay as possible. The aim is also to create a housing with such a cable which is particularly suitable for carrying out this method.

The first-named problem is solved according to the invention by virtue of the fact that the conductor is produced by bending over an end region of the cable strand transverse to the direction of the main extent of the cable.

Such a mode of procedure saves one component, specifically the soldering pin to be injection molded into the housing. In accordance with the invention, this soldering pin is produced by bending over the end region of the cable strand. This bending over of the end region of the cable strand requires substantially less outlay than soldering the soldering pin onto the cable strand, with the result overall that not only are the costs lowered by economizing on a component, but the outlay on production is also further reduced.

The required bending-over of the cable strand can be performed positively when mounting the cable, with the result that no additional work operation is required when, in accordance with a development of the method, the cable strand is bent over by pushing the cable transverse to its main extent into a cable receptacle which is open toward the side of the printed circuit board.

The second-named problem, specifically the creation of a housing, provided with a cable, for holding a printed circuit board, is solved according to the invention by virtue of the fact that the cable receptacle is guided into the housing starting from the side of the printed circuit board, and the conductor leading to the printed circuit board is formed by bending over the front end of the cable strand. It is possible with the aid of such a housing to produce a component with a printed circuit board in a very cost-effective fashion, because the cable for the component can be mounted and connected to the printed circuit board in a particularly simple way.

Tensile forces on the cable do not have the effect that the cable comes out of the cable receptacle and the connection between the cable strand and the printed circuit board is destroyed, if the cable receptacle has on at least one side a rib which constricts its cross section and owing to which the remaining cross section is smaller than corresponds to the outside diameter of the cable, and which ends at a spacing from the base surface of the cable receptacle which is greater than the radius of the cable but smaller than its diameter. Since the rib does not reach up to the base of the cable receptacle, it simultaneously prevents the cable from being able to come out of the cable receptacle toward the side of the printed circuit board.

The cable is held in a particularly effective way in the cable receptacle when, in accordance with another development of the invention, ribs are provided on both opposite sides of the cable receptacle.

The cable is held very firmly in the cable receptacle without undesirably large forces being required to push it in when a total of three ribs are provided on each side.

The ribs press into the insulation of the cable and hold the cable in a self-closed fashion when the ribs have a cross section in the shape of a triangle whose vertex is directed toward the cable.

BRIEF DESCRIPTION OF THE DRAWING

The invention permits various embodiments. One of these is represented in the drawing and described below for the purpose of further illustrating the basic principle of the invention. In the figures of the drawing

DETAILED DESCRIPTION OF THE PREFERRED EMBODIMENT

Figure 1:
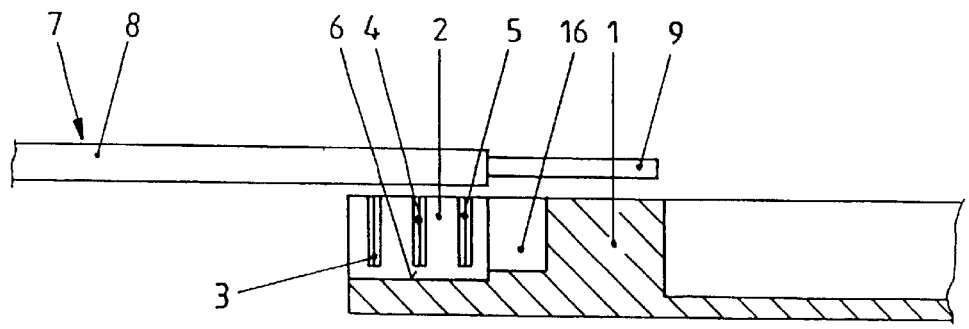
FIG. 1 shows a section through a housing having a cable, before inserting into a cable receptacle of the housing.

FIG. 1 shows a housing 1 having a cable receptacle 2 which is configured as an upwardly open housing cutout and whose cross section is constricted by ribs 3, 4, 5. These ribs 3, 4, 5 lead from above into the cable receptacle 2 and end at a slight spacing from a base surface 6 of the cable receptacle 2.

Represented above the housing 1 in FIG. 1 is a cable 7 which has a cable strand 9, designed as a tinned copper litz wire, and an insulation 8. A front region of the cable strand 9 has been freed from the insulation 8 and extends in FIG. 1 into the direction of the main extent of the cable 8 out of the cable receptacle 2 to over the housing 1.

Figure 2:
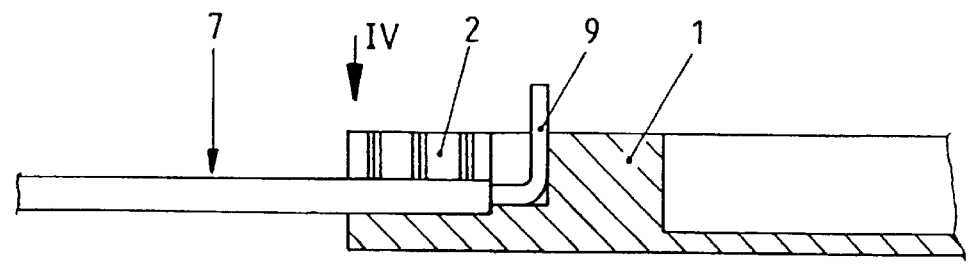
FIG. 2 shows the arrangement according to FIG. 1, after insertion of the cable.

If the cable 7 is pressed transverse to the direction of its main extent into the cable receptacle 2, the front end of the cable strand 9 comes against the housing 1 and is bent away by 90°, in order to permit the cable 7 to go completely into the cable receptacle 2, which is shown in FIG. 2. It is to be seen therefrom that the front end of the cable strand 9 projects upwards like a pin from the cable receptacle 2.

Figure 3:
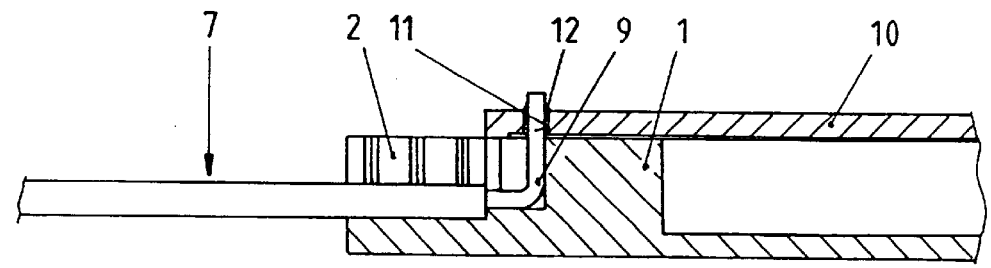
FIG. 3 shows the arrangement according to FIGS. 1 and 2 after the mounting of the printed circuit board.

In the manufacturing stage shown in FIG. 3, a printed circuit board 10 has been mounted on the housing 1 in such a way that the end of the cable strand 9 projects through a bore 11 in the printed circuit board 10. The electric connection between the printed circuit board and the cable strand 9 has been produced by a soldered joint 12.

Figure 4:
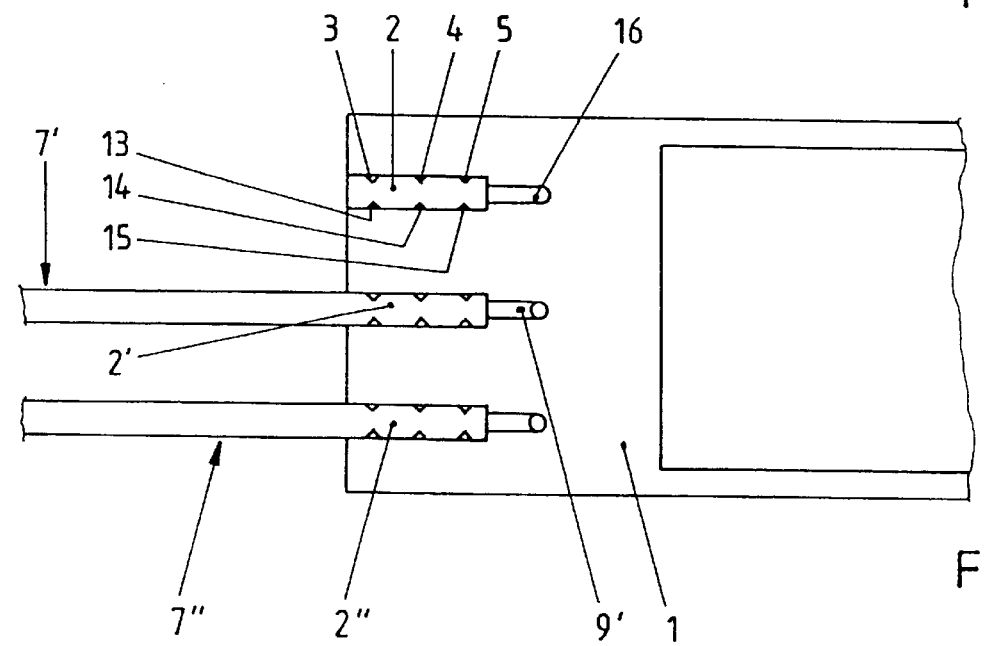
FIG. 4 shows a plan view of the arrangement according to FIG. 2.

It is to be seen from FIG. 4 that, on their opposite sides, the cable receptacles 2 in each case have three ribs 3, 4, 5 and 13, 14, 15 which are opposite one another, and that these have a triangular cross section, the respective vertices projecting into the cable receptacle 2. It is also to be seen in FIG. 4 that the cable receptacle 2 has a continuation 16 of small width which is slightly larger than the diameter of the cable strand 9. The housing 1 in accordance with FIG. 4 has a total of three cable receptacles 2, 2' and 2", one cable 7' and 7" each being illustrated in the cable receptacles 2' and 2".

What is claimed is:

1. A method for connecting a cable to a printed circuit board supported on a bottom side thereof by a housing, wherein the cable is to be inserted into a cable receptacle of the housing, and an end region of a conductor of the cable is led in a direction transverse to the direction of the main extent of the cable from the cable receptacle through the printed circuit board and is soldered to the printed circuit board on a top side thereof, wherein the conductor is produced by the step of bending over an end region of a cable strand transverse to the direction of the main extent of the cable, there being a further step of providing said cable receptacle with a rib directed transversely to the longitudinal direction of a cable located in said cable receptacle, and a step of pressing said rib into said cable.

2. The method as claimed in claim 1, wherein the step of bending over the cable strand is by pushing the cable transverse to its main extent into said cable receptacle which is open toward the side of the printed circuit board.

3. A housing for holding a printed circuit board, the housing having a cable receptacle for receiving a cable having a conductor, wherein the housing is connectable to a printed circuit board by means of the conductor, wherein the cable receptacle (2) extends into the housing (1) starting from the side of the printed circuit board (10), and an end portion of the conductor leading to the printed circuit board (10) is formed by bending over the front end of a cable strand (10), the cable receptacle having a rib directed transversely of the longitudinal direction of a cable located in the receptacle, the rib constricting a cross section of the cable receptacle.

4. A housing for holding a printed circuit board, the housing having a cable receptacle for receiving a cable having a conductor, wherein the housing is connectable to a printed circuit board by means of the conductor, wherein the cable receptacle (2) extends into the housing (1) starting from the side of the printed circuit board (10), and an end portion of the conductor leading to the printed circuit board (10) is formed by bending over the front end of a cable strand (10); and wherein said cable receptacle has on at least one side a rib (3, 4, 5) which constricts its cross section and due to which the remaining cross section is smaller than corresponds to the outside diameter of the cable (7), and which ends at a spacing from the base surface (6) of the cable receptacle (2) which is greater than the radius of the cable (7) but smaller than its diameter.

5. The housing as claimed in claim 4, wherein said ribs (3, 4, 5; 13, 14, 15) are provided on both opposite sides of the cable receptacle (2).

6. The housing as claimed in claim 4, wherein a total of three said ribs (3, 4, 5; 13, 14, 15) are provided on each side.

7. The housing as claimed in claim 4, wherein the ribs (3, 4, 5; 13, 14, 15) have a cross section in the shape of a triangle whose vertex is directed toward the cable (7).

* * * * *